(12) United States Patent
Yang

(10) Patent No.: US 12,414,263 B2
(45) Date of Patent: *Sep. 9, 2025

(54) COOLING TRAY CONNECTOR ASSEMBLY

(71) Applicant: Molex, LLC, Lisle, IL (US)

(72) Inventor: Che-Yuan Yang, New Taipei (TW)

(73) Assignee: Molex, LLC, Lisle, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/211,307

(22) Filed: Jun. 19, 2023

(65) Prior Publication Data

US 2023/0337393 A1 Oct. 19, 2023

Related U.S. Application Data

(63) Continuation of application No. 17/349,976, filed on Jun. 17, 2021, now Pat. No. 11,729,941.

(30) Foreign Application Priority Data

Jun. 18, 2020 (CN) .......................... 202010559236.4

(51) Int. Cl.
*H01R 4/60* (2006.01)
*H01R 13/518* (2006.01)
*H05K 7/20* (2006.01)

(52) U.S. Cl.
CPC ....... *H05K 7/20218* (2013.01); *H01R 13/518* (2013.01)

(58) Field of Classification Search
CPC .......................... H01R 13/518; H05K 7/20218
USPC ........................................................ 439/199
See application file for complete search history.

(56) References Cited

U.S. PATENT DOCUMENTS

| | | | | |
|---|---|---|---|---|
| 4,644,385 A | * | 2/1987 | Nakanishi | H01L 23/473 |
| | | | | 257/E23.091 |
| 5,473,508 A | * | 12/1995 | Porter | H01L 23/467 |
| | | | | 257/713 |
| 6,816,376 B2 | * | 11/2004 | Bright | G02B 6/4201 |
| | | | | 165/185 |
| 6,980,437 B2 | * | 12/2005 | Bright | H04B 1/036 |
| | | | | 361/704 |

(Continued)

FOREIGN PATENT DOCUMENTS

| | | |
|---|---|---|
| CN | 102067063 A | 5/2011 |
| CN | 103201911 B | 9/2016 |

(Continued)

OTHER PUBLICATIONS

Notice of Allowance received for U.S. Appl. No. 17/349,976, mailed on Mar. 21, 2023, 12 pages.

*Primary Examiner* — Harshad C Patel
*Assistant Examiner* — Vladimir Imas

(57) ABSTRACT

An example connector assembly includes a cage, a first liquid cooling tray, a second liquid cooling tray, and a pressuring spring. The cage includes a frame and partitioning walls. The frame and the partitioning walls define an insertion space. The first liquid cooling tray is provided to a top of the cage, with a lower surface of the first liquid cooling tray constituting an upper wall surface of the insertion space. The second liquid cooling tray is provided to a bottom of the cage, with an upper surface of the second liquid cooling tray constituting a lower wall surface of the insertion space. The pressuring spring is positioned within the insertion space.

20 Claims, 13 Drawing Sheets

(56) References Cited

U.S. PATENT DOCUMENTS

| | | | |
|---|---|---|---|
| 6,986,679 B1 | 1/2006 | Aronson et al. | |
| 7,371,965 B2 | 5/2008 | Ice | |
| 7,539,018 B2* | 5/2009 | Murr | H05K 7/20418 439/372 |
| 7,625,223 B1 | 12/2009 | Fogg | |
| 8,223,498 B2 | 7/2012 | Lima | |
| 8,345,426 B2* | 1/2013 | Nichols | H05K 7/1418 361/756 |
| 8,382,509 B2* | 2/2013 | David | H01R 13/6471 439/342 |
| 8,432,694 B2* | 4/2013 | Hentschel | H05K 7/20218 165/80.4 |
| 8,444,437 B2* | 5/2013 | Szczesny | H01R 13/6587 439/607.17 |
| 8,449,331 B2* | 5/2013 | Phillips | H01R 13/6581 439/607.21 |
| 8,556,658 B2* | 10/2013 | Szczesny | G02B 6/4278 439/607.2 |
| 8,670,236 B2* | 3/2014 | Szczesny | H05K 9/0009 174/358 |
| 8,879,262 B2* | 11/2014 | Shi | G02B 6/4246 165/185 |
| 8,879,267 B2* | 11/2014 | Henry | H04L 12/6418 361/709 |
| 9,258,925 B2* | 2/2016 | Arvelo | G06F 1/20 |
| 9,793,648 B2* | 10/2017 | Regnier | G02B 6/4201 |
| 9,913,403 B2* | 3/2018 | Krug, Jr. | H05K 7/20781 |
| 9,935,403 B1* | 4/2018 | Briant | H05K 9/0018 |
| 9,960,525 B2* | 5/2018 | Regnier | G02B 6/4201 |
| 9,980,411 B2 | 5/2018 | Yang | |
| 10,104,760 B1* | 10/2018 | Briant | G02B 6/4284 |
| 10,249,983 B2 | 4/2019 | Regnier et al. | |
| 10,276,995 B2* | 4/2019 | Little | G02B 6/4284 |
| 10,278,313 B2* | 4/2019 | Jia | H05K 1/144 |
| 10,321,607 B2* | 6/2019 | Ito | G02B 6/42 |
| 10,539,753 B1 | 1/2020 | Leigh | |
| 10,709,034 B2* | 7/2020 | Jochim | H05K 7/20781 |
| 10,765,038 B1* | 9/2020 | Leigh | H05K 7/20772 |
| 10,795,096 B1* | 10/2020 | Leigh | G02B 6/4448 |
| 10,795,100 B2* | 10/2020 | Leigh | G06F 1/185 |
| 10,856,446 B2* | 12/2020 | Boyden | G06F 1/183 |
| 11,165,185 B2* | 11/2021 | Lloyd | H01R 13/502 |
| 11,483,943 B2* | 10/2022 | Leigh | H05K 7/20772 |
| 2005/0168932 A1* | 8/2005 | Selvidge | H05K 7/1425 361/679.02 |
| 2009/0109627 A1* | 4/2009 | Murr | H05K 7/20418 361/704 |
| 2013/0157499 A1 | 6/2013 | Crippen et al. | |
| 2015/0077937 A1* | 3/2015 | Daly | G02B 6/4268 361/699 |
| 2016/0290728 A1* | 10/2016 | Coteus | H05K 7/20254 |
| 2019/0246523 A1 | 8/2019 | Boyden et al. | |
| 2021/0153385 A1* | 5/2021 | Lu | H05K 7/20254 |

FOREIGN PATENT DOCUMENTS

| | | |
|---|---|---|
| CN | 105445859 B | 6/2017 |
| CN | 106304754 B | 7/2019 |
| CN | 110058358 A | 7/2019 |
| CN | 108061943 B | 1/2020 |
| CN | 110658595 A | 1/2020 |
| CN | 110806620 A | 2/2020 |
| CN | 111083903 A | 4/2020 |
| CN | 212160165 U | 12/2020 |
| CN | 111033916 B | 10/2021 |
| CN | 114966998 A | 8/2022 |
| CN | 115275716 A | 11/2022 |
| CN | 112993659 B | 9/2023 |
| CN | 111208611 B | 10/2024 |

\* cited by examiner

COOLING TRAY CONNECTOR ASSEMBLY

CROSS REFERENCE TO RELATED APPLICATIONS

This application is a continuation of U.S. Non-Provisional patent application Ser. No. 17/349,976, filed Jun. 17, 2021, titled "CONNECTOR ASSEMBLY," and claims the benefit of priority to Chinese Patent Application No. 202010559236.4, filed Jun. 18, 2020, the entire contents of both of which applications are hereby incorporated herein by reference.

TECHNICAL FIELD

The present disclosure relates to a connector assembly, and particularly relates to a connector assembly having a liquid cooling tray.

BACKGROUND

U.S. Pat. No. 7,625,223 B1 discloses a receptacle assembly which includes a guide frame, a heat sink, and a conductive gasket. The guide frame includes a top wall and defines an internal cavity configured to receive a mating connector. The top wall defines an opening which is communicated with the internal chamber. The heat sink is held in the internal cavity such that an upper portion of the heat sink passes through the opening and a lower portion of the heat sink is engaged with the mating connector when the mating connector is inserted into the internal cavity. The conductive gasket is held between the guide frame and the heat sink. The heat sink includes an engagement portion, when the mating connector is inserted into the internal cavity, the engagement portion provides a thermally conductive pathway for the mating connector. The conductive gasket is configured to be compressed between the guide frame and the heat sink so that the conductive gasket provides a conductive path between the heat sink and the guide frame. However, the heat sink disclosed in this prior art is generally a metal heat sink with heat dissipation fins, a principle thereof is that heat is brought out by an air flow between the heat dissipation fins, heat dissipation performance of the heat sink is slightly insufficient when the heat sink is used in a connector assembly which has a higher transmission speed and generates more heat.

Chinese invention patent application publication No. CN110139534A (corresponding to United States patent application publication No. US2019/0246523A1) discloses a cooling device which includes a manifold and a plurality of pedestals. The manifold includes a housing that encloses an interior cavity, the interior cavity is used to receive a cooling fluid and circulate the cooling fluid. Each of the pedestals is individually and flexibly coupled to the housing of the manifold via a bellows which is used to seal and is ring-shaped. Each pedestal is configured to extend outwardly from a bottom surface of the housing when a fluid pressure is present within the interior cavity. However, the bellows in this prior art only provides a flexible connection between the pedestal and the manifold, only there is a fluid pressure in the inner cavity of the manifold can the pedestal have a sufficient energy to extend outwardly from the bottom surface of the housing of the manifold. Firstly, the bellows as a connection sealing member between the pedestal and the manifold is not only complex in structure but also difficult to manufacture; secondly, because only the pedestal needs to use a fluid pressure can the pedestal extend outwardly, when the fluid pressure is insufficient or unstable, it is prone to cause a protruding amount of the pedestal which protrudes from the manifold insufficient, which results in a pressure of the pedestal contacting an electrical module is insufficient or even the pedestal cannot contact the electrical module, in turn heat dissipation efficiency is lowered. In addition, when a plurality of electrical modules need to contact the individual pedestals on the manifold at the same time, with respect to a case that the protruding amount of each pedestal which protrudes from the manifold is insufficient and an elastic restoring force of each pedestal relative to the manifold is insufficient, due to tolerances of individual electrical modules, the individual electrical modules cannot contact the respective pedestals on the manifold at the same time.

SUMMARY

Therefore, an object of the present disclosure is to provide a connector assembly which can improve at least one of the deficiencies in the prior art.

An example connector assembly includes a cage, a first liquid cooling tray, a second liquid cooling tray, and a pressuring spring. The cage includes a frame and partitioning walls. The frame and the partitioning walls define an insertion space. The first liquid cooling tray is provided to a top of the cage, with a lower surface of the first liquid cooling tray constituting an upper wall surface of the insertion space. The second liquid cooling tray is provided to a bottom of the cage, with an upper surface of the second liquid cooling tray constituting a lower wall surface of the insertion space. The pressuring spring is positioned within the insertion space.

In other aspects, the pressuring spring is provided on the upper surface of the second liquid cooling tray within the insertion space. The pressuring spring can include a plurality of spring plates extending into the insertion space from the upper surface of the second liquid cooling tray in one example. In another example, the pressuring spring includes a mounting portion assembled to the upper surface of the second liquid cooling tray and a spring plate extending from the mounting portion into the insertion space.

In other aspects, the mounting portion of the pressuring spring can include a plate body assembled to the upper surface of the second liquid cooling tray and a frame body folded back from the plate body onto an upper surface of the plate body, and the spring plate can extend from an inner edge of the frame body into the insertion space. In another example, the mounting portion of the pressuring spring can be positioned at a front end of the pressuring spring, and the spring plate can extends from the mounting portion into the insertion space.

In other aspects, the partitioning walls can be assembled to the first liquid cooling tray and the second liquid cooling tray. In one example, a first positioning recess can be formed on the lower surface of the first liquid cooling tray, a second positioning recess can be formed on the upper surface of the second liquid cooling tray, and a partitioning wall among the partitioning walls includes positioning protrusions which are snapped into the first positioning recess and the second positioning recess.

In other examples, the partitioning walls can define a number of insertion spaces, the lower surface of the first liquid cooling tray can constitute an upper wall surface of the plurality of insertion spaces, and the upper surface of the second liquid cooling tray can constitute a lower wall surface of the plurality of insertion spaces. The insertion space can include a first insertion space among a number of insertion spaces, and the connector assembly further includes a second pressuring spring within a second insertion space among the number of insertion spaces.

Another example connector assembly includes a cage, a first liquid cooling tray, a second liquid cooling tray, a first pressuring spring, and a second pressuring spring. The cage includes an upper cage, a lower cage, a frame, and partitioning walls. The frame and the partitioning walls define an upper insertion space in the upper cage and a lower insertion space in the lower cage. The first liquid cooling tray is provided to a top of the upper cage, with a lower surface of the first liquid cooling tray constituting an upper wall surface of the upper insertion space. The second liquid cooling tray is provided between the upper cage and the lower cage, with an upper surface of the second liquid cooling tray constituting a lower wall surface of the upper insertion space and a lower surface of the second liquid cooling tray constituting an upper wall surface of the lower insertion space. The first pressuring spring is positioned within the upper insertion space, and the second pressuring spring is positioned within the lower insertion space.

Another example connector assembly includes a cage, a liquid cooling tray, and a pressuring spring. The cage includes a frame and partitioning walls. The frame and the partitioning walls define an insertion space. The liquid cooling tray is provided to a top of the cage, with a lower surface of the liquid cooling tray constituting an upper wall surface of the insertion space. The pressuring spring is positioned within the insertion space.

BRIEF DESCRIPTION OF THE DRAWINGS

Other features and technical effects of the present disclosure will be apparent in an embodiment referring to the accompanying figures, in which.

DETAILED DESCRIPTION

Figure 1:
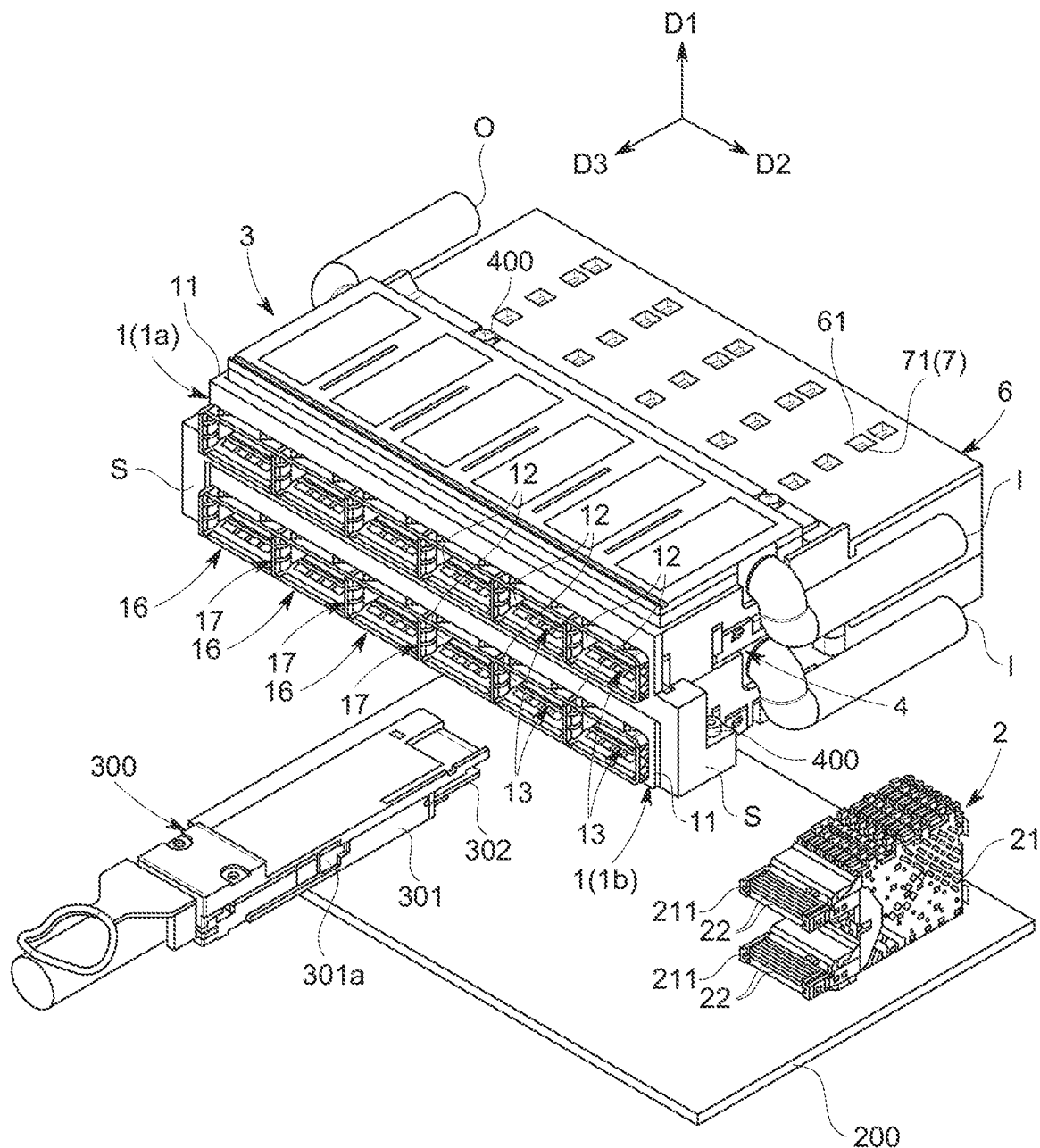
FIG. 1 is a perspective exploded view of a first embodiment of a connector assembly of the present disclosure, a circuit board and a pluggable module.

Before the present disclosure is described in detail, it is noted that like elements are represented by the same reference numerals in the following description.

Figure 2:
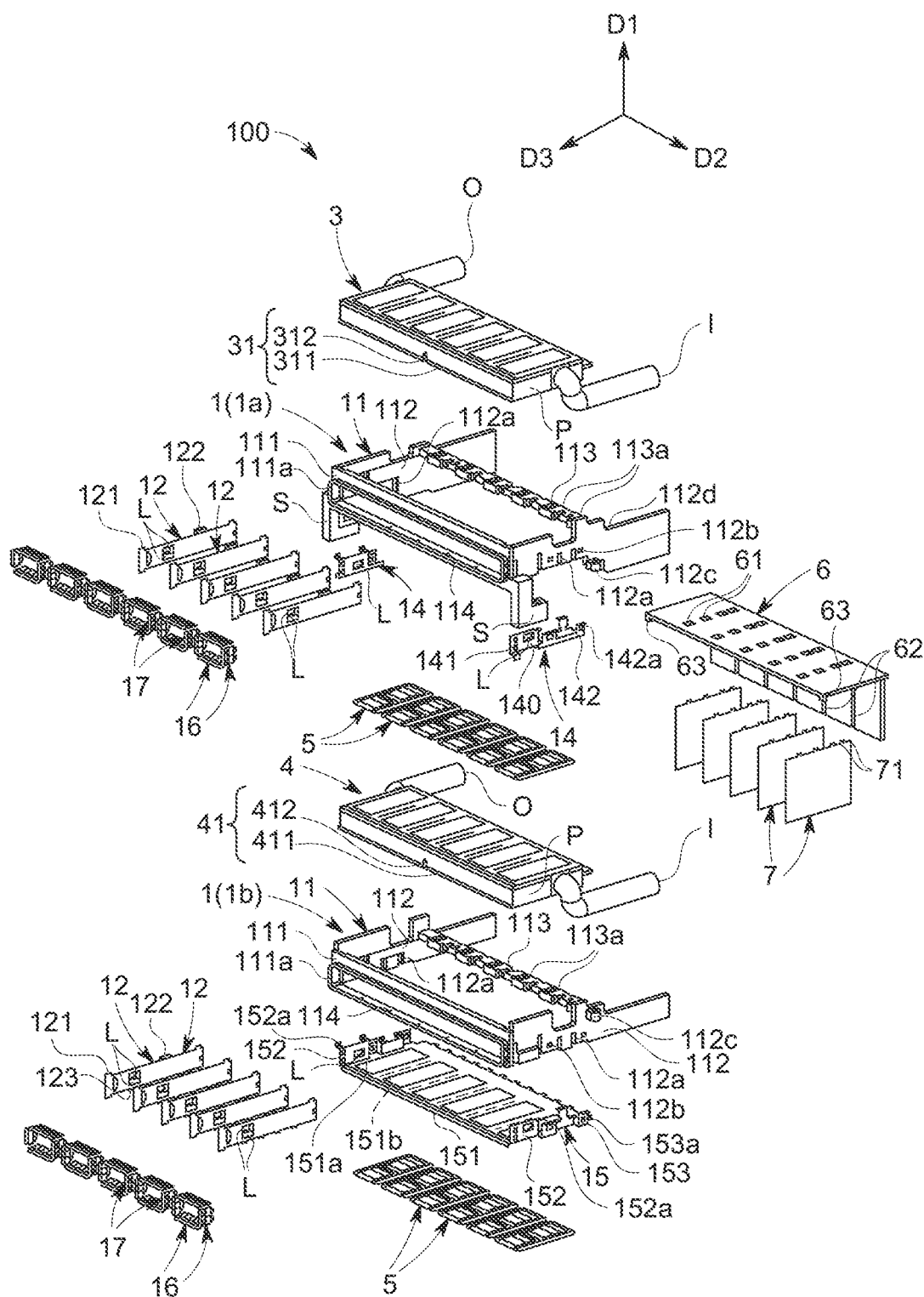
FIG. 2 is a perspective exploded view of the first embodiment.
Figure 3:
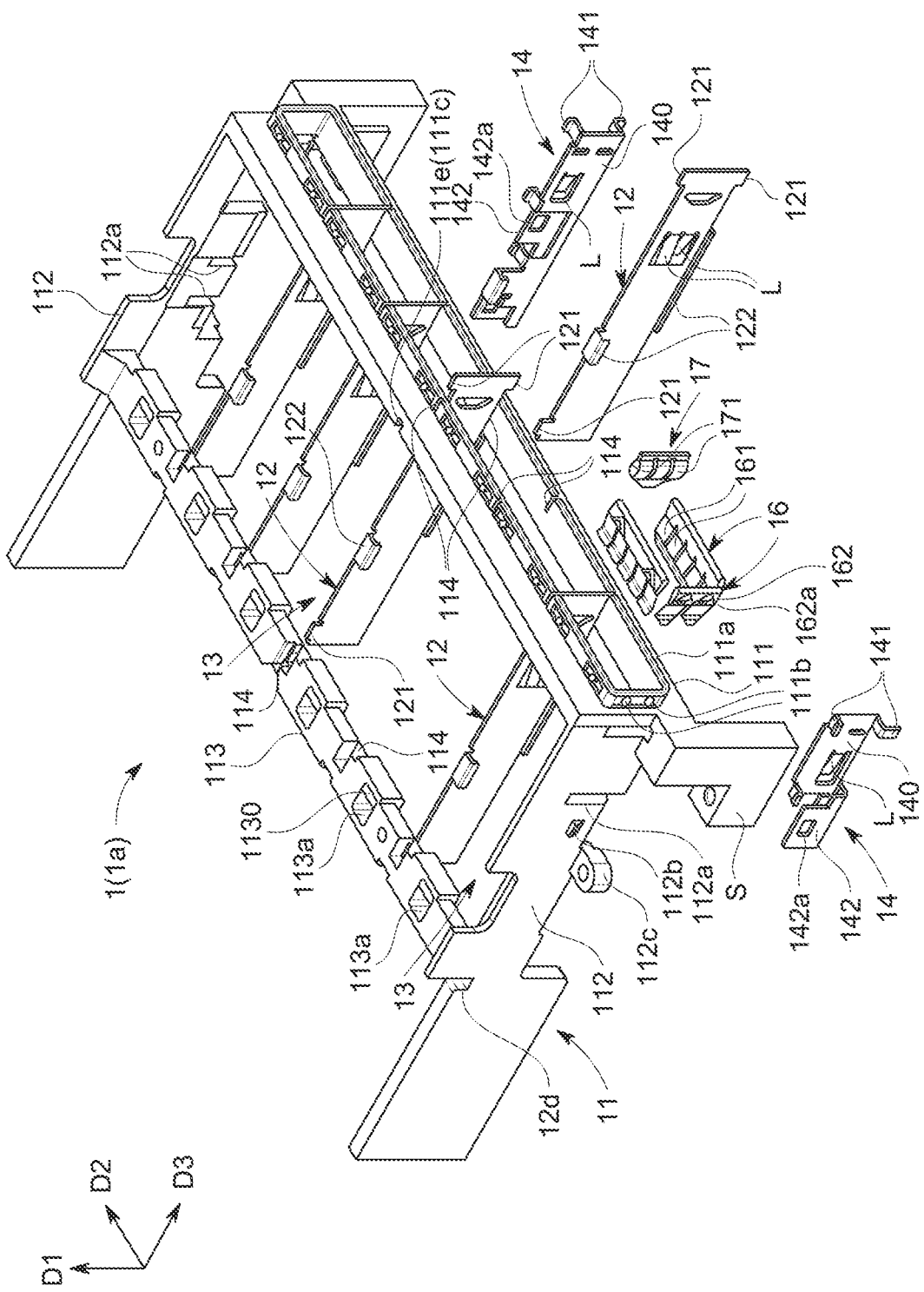
FIG. 3 is a perspective exploded view of a cage of the first embodiment positioned in the upper.
Figure 4:
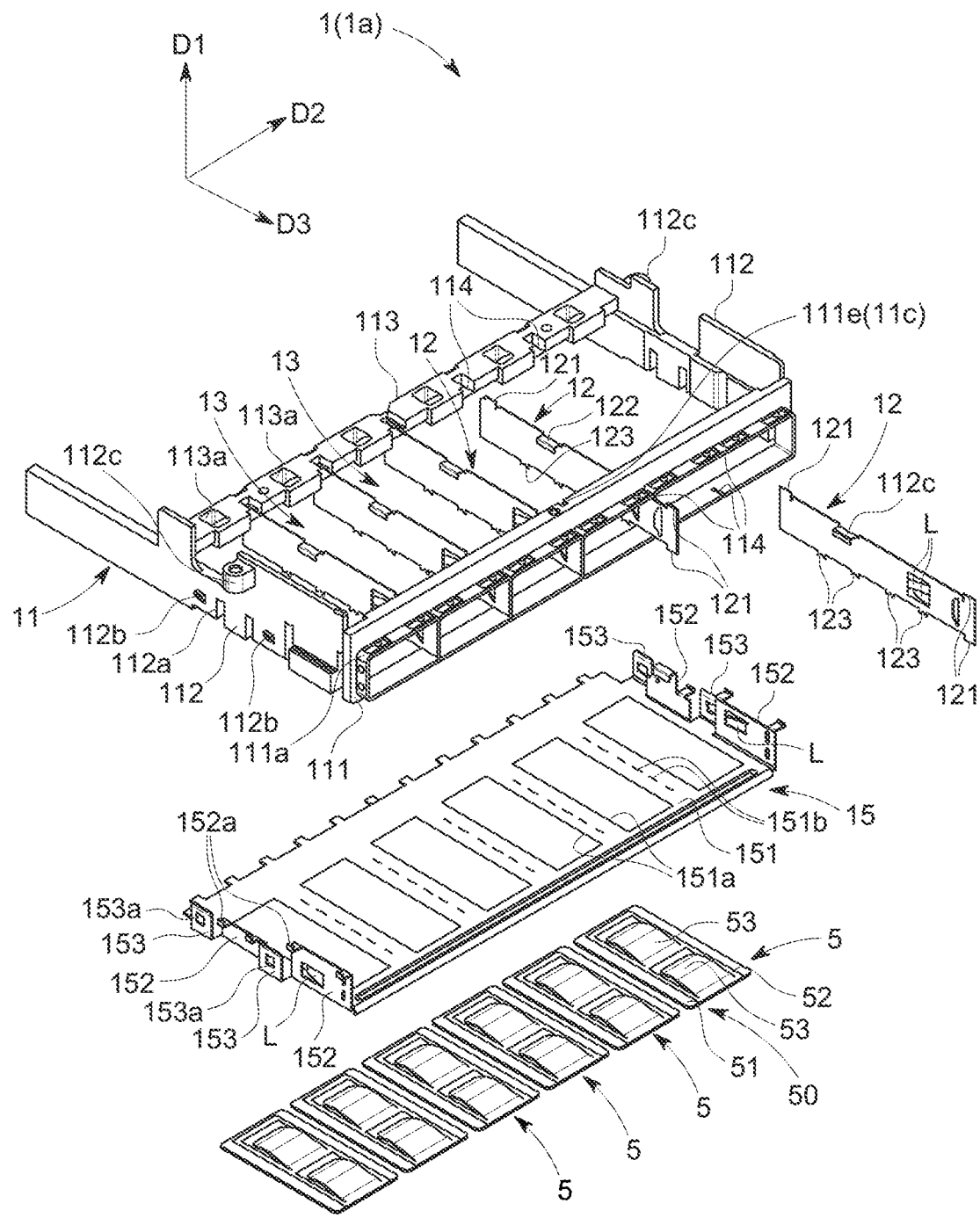
FIG. 4 is a perspective exploded view of a cage of the first embodiment positioned in the lower.
Figure 5:
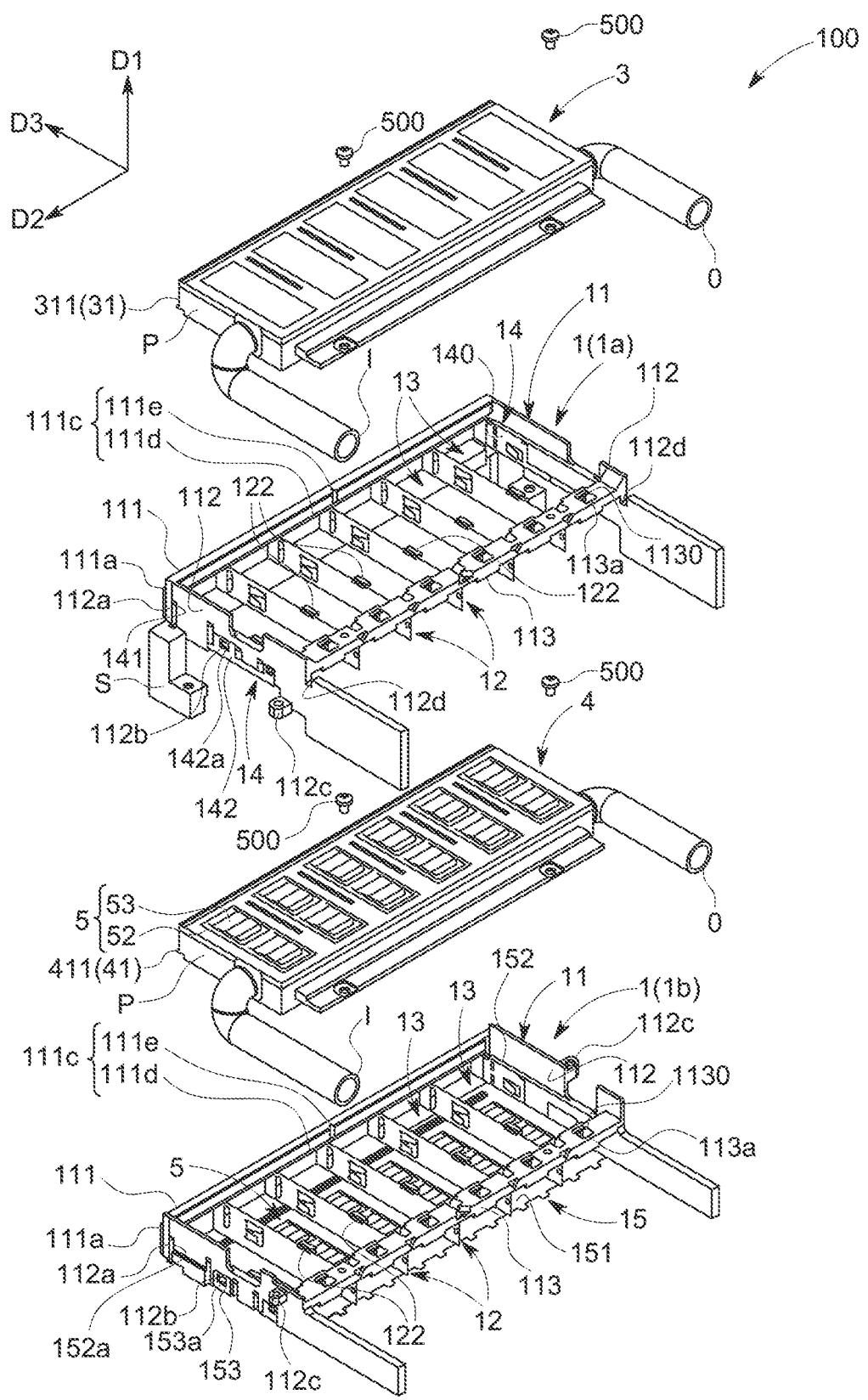
FIG. 5 is a perspective exploded view of the cages, a first liquid cooling tray and a second liquid cooling tray of the first embodiment.
Figure 6:
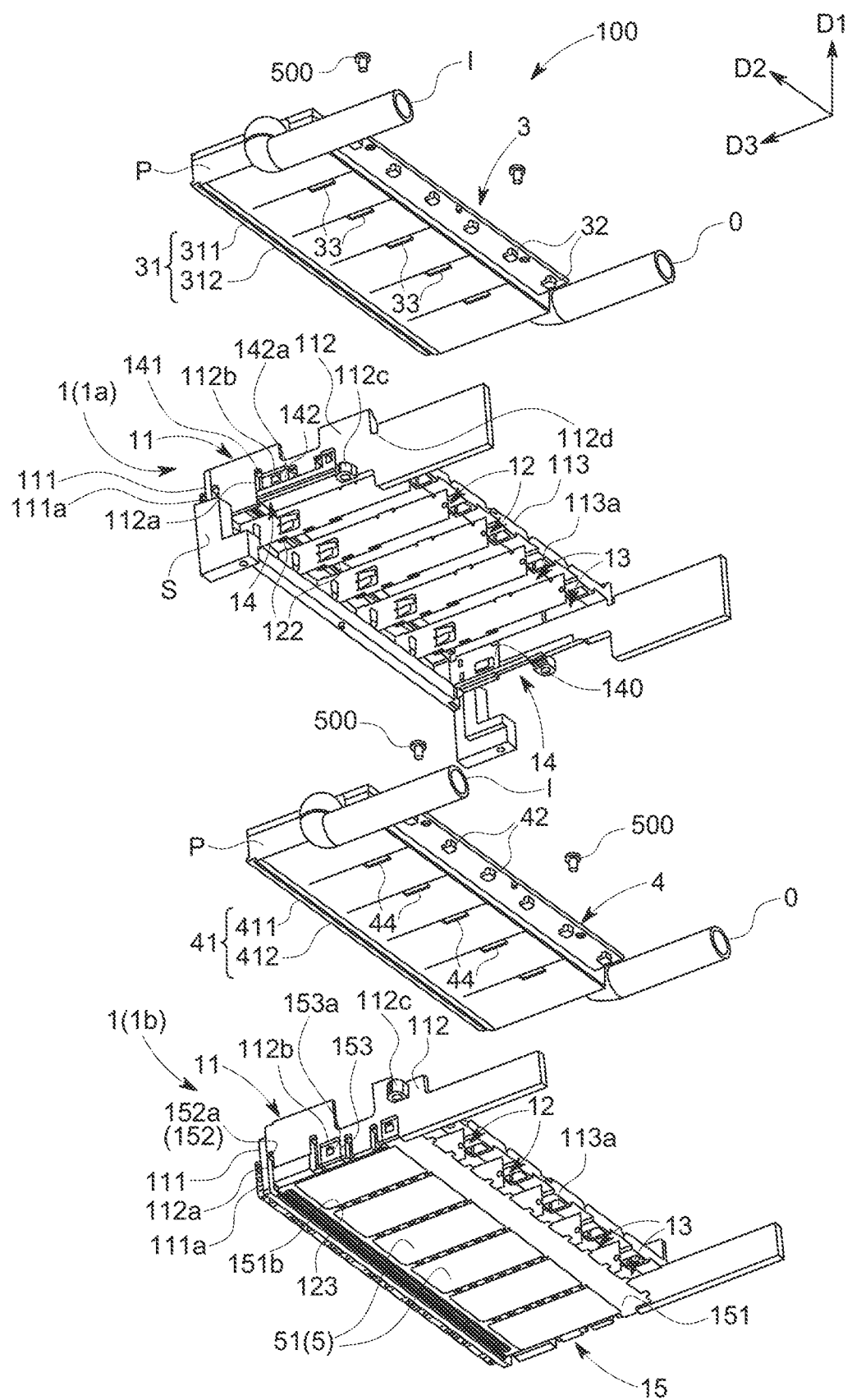
FIG. 6 is a perspective exploded view of the cages, the first liquid cooling tray and the second liquid cooling tray of the first embodiment of FIG. 5 viewed from another angle.
Figure 7:
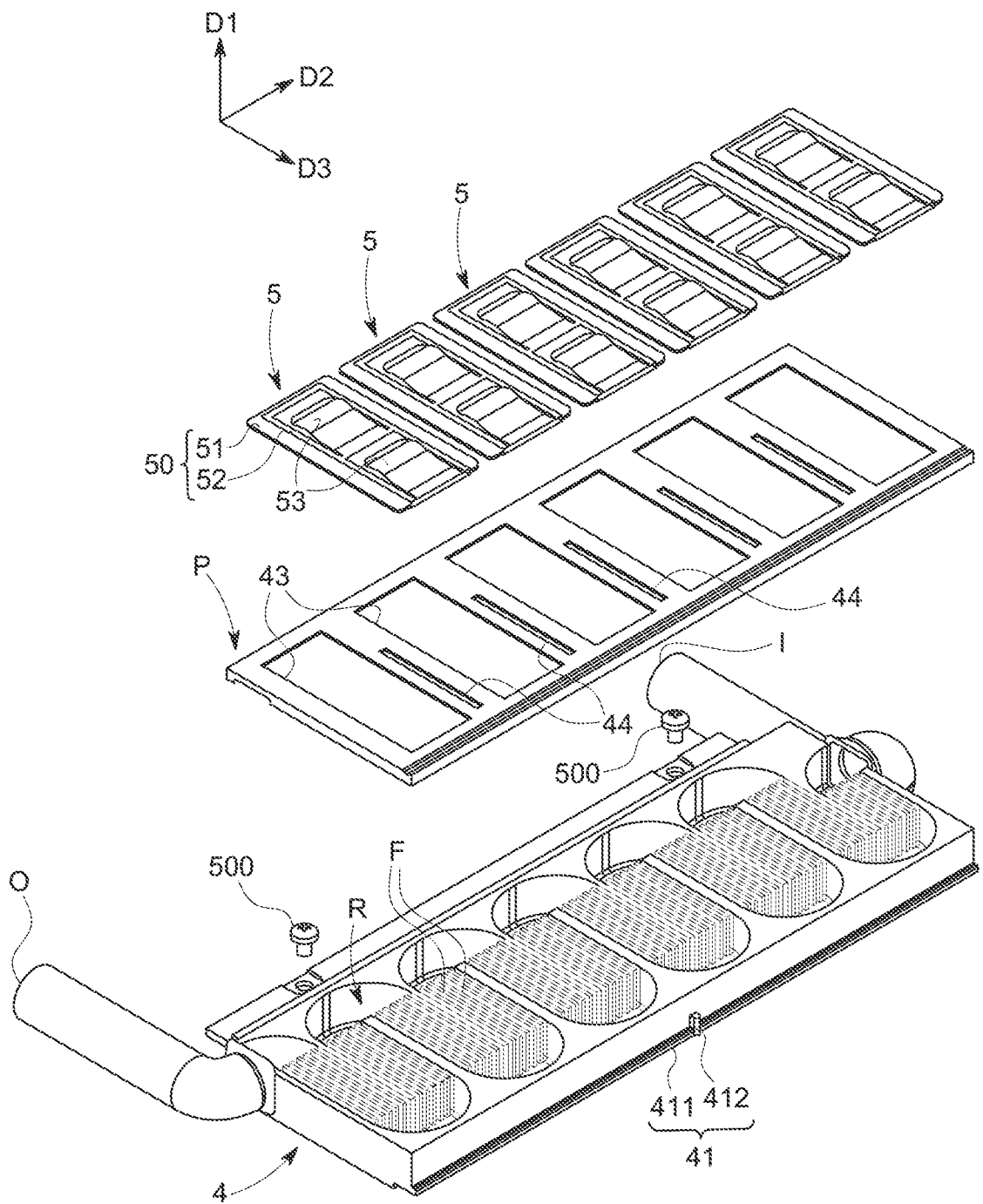
FIG. 7 is a perspective exploded view of the second liquid cooling tray and a pressuring spring of the first embodiment.
Figure 8:
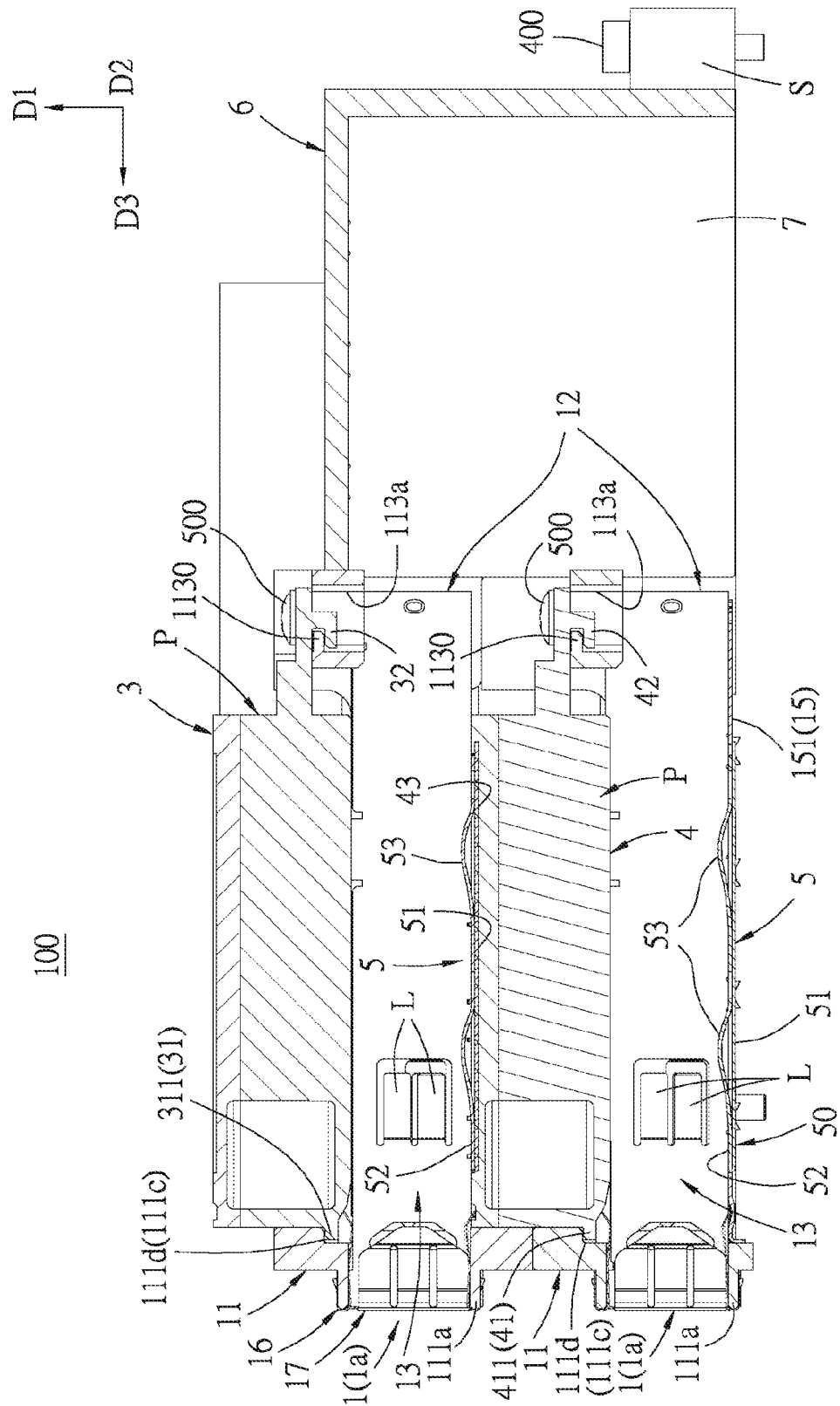
FIG. 8 is a cross sectional view of the first embodiment.

Referring to FIG. 1 and FIG. 2, a first embodiment of a connector assembly 100 of the present disclosure is adapted to be provided to a circuit board 200 and is adapted to be mated with a pluggable module 300. The connector assembly 100 includes two cages 1, a plurality of receptacle connectors 2, a first liquid cooling tray 3, a second liquid cooling tray 4 and a plurality of pressuring springs 5. It is noted that, for sake of clearly illustration and easy understanding, only one of the plurality of receptacle connectors 2 and one of the pluggable modules 300 are shown in FIG. 1.

Referring to FIGS. 1 to 4, the two cages 1 are arranged in an up-down direction D1 (a direction pointed by an arrow of D1 is up, and a direction opposite thereto is down). Hereinafter, a cage positioned in the upper is referred to as an upper cage 1a, and a cage positioned in the lower is referred to as a lower cage 1b. Each cage 1 includes a frame 11 and a plurality of partitioning walls 12 which are provided to the frame 11, are arranged side by side along a left-right direction D2 (a direction pointed by an arrow of D2 is right, and a direction opposite thereto is left) and are spaced apart from each other. In the first embodiment, the frame 11 is formed by metal die-casting, the plurality of partitioning walls 12 are formed for example by punching a metal sheet, so the frame 11 as a main structure of the cage 1 has a higher strength and more manufacturing cost is saved for the plurality of partitioning walls 12, requirements of high strength and low cost are considered at the same time. However, in other embodiments, the frame 11 and the plurality of partitioning walls 12 may be formed integrally or separately in other manufacturing manners. The plurality of partitioning walls 12 are assembled to the frame 11 in form of assembling configuration. The frame 11 and the plurality of partitioning walls 12 together define a plurality of insertion spaces 13 which are arranged transversely along the left-right direction D2 and each are opened forwardly in a front-rear direction D3 (a direction pointed by an arrow of D3 is front and a direction opposite thereto is rear), the plurality of insertion spaces 13 each allow the pluggable module 300 to insert therein In the first embodiment, the lower cage 1b further includes a bottom plate 15 which is assembled to the frame 11 and constitutes a lower wall surface of each of the plurality of insertion spaces 13 of the lower cage 1b. The bottom plate 15 is formed by a metal sheet in the first embodiment.

Specifically, the frame 11 of each cage 1 has a front frame portion 111 which is positioned at a front end of the frame 11 and extends along the left-right direction D2, two side frame portions 112 which extend rearwardly from a left side and a right side of the front frame portion 111 respectively, and a rear frame portion 113 which is connected between the two side frame portions 112 and is positioned behind the front frame portion 111. A front end of the front frame portion 111 is formed with an insertion frame 111a which extends forwardly and surrounds a front end of the plurality of insertion spaces 13. Each partitioning wall 12 is formed with a plurality of engaging pieces 121 which bend laterally from front and rear ends of a top edge and a bottom edge of each partitioning wall 12. The insertion frame 111a and the rear frame portion 113 of the frame 11 are formed with a plurality of engaging grooves 114 which extend from the front to the rear and allow the plurality of partitioning walls 12 respectively to insert rearwardly and allow the plurality of engaging pieces 121 to correspondingly engage with the insertion frame 111a and the rear frame portion 113 of the frame 11 respectively. Each side frame portion 112 of each cage 1 is formed with a positioning groove 112a which extends upwardly from a bottom of each side frame portion 112 and a latching block 112b which protrudes outwardly from an outer side surface of each side frame portion 112. The upper cage 1a further includes two locking members 14 which are assembled to the two side frame portions 112 of the frame 11 respectively. Each locking member 14 includes a locking portion 140 which is positioned at an inner side surface of the side frame portion 112 and a fixing portion 142 which is latched to the outer side surface of the corresponding side frame portion 112. The locking member 140 has a locking piece L thereon, the locking portion 140 is provided with a positioning piece 141 which is snapped into the positioning groove 112a of the corresponding side frame portion 112. Furthermore, the positioning piece 141 further can hook the outer side surface of the side frame portion 112, the fixing portion 142 is formed with a latching hole 142a which correspondingly receives the latching block 112b The bottom plate 15 of the lower cage 1b has a bottom plate portion 151, locking portions 152 which extend upwardly respectively from a left side edge and a right side edge of the bottom plate portion 151 respectively, and latching portions 153 which extend upwardly from the left side edge and the right side edge of the bottom plate portion 151 respectively and each are positioned at an outside of the corresponding locking portion 152. The locking portion 152 is assembled to an inner side surface of the corresponding side frame portion 112, the latching portion 153 is latched to the outer side surface of the corresponding side frame portion 112. The locking portion 152 is formed with a positioning piece 152a which is snapped into the positioning groove 112a of the corresponding side frame portion 112. Furthermore, the positioning piece 152a further can hook the outer side surface of the side frame portion 112, the latching portion 153 is formed with a latching hole 153a which correspondingly receives the latching block 112b. In addition, it is noted that, the partitioning wall 12, the locking portion 140 of the locking member 14 and the locking portion 152 each are formed with a locking piece L which protrudes into the insertion space 13. When the pluggable module 300 is inserted into the insertion space 13, the locking member L snaps into a locking groove 301a which is formed to each of both sides of a mating portion 301 of the pluggable module 300, so that the pluggable module 300 is locked in the insertion space 13. In addition, each cage 1 further includes a plurality of first elastic grounding elements 16 which are assembled to the insertion frame 111a of the frame 11 and a plurality of second elastic grounding members 17 which are assembled at front ends of the plurality of partitioning walls 12. Each first elastic grounding member 16 has a first inner side elastic finger 161 which is provided at an inner side of the insertion frame 111a and extends into the corresponding insertion space 13 and a first outer side elastic finger 162 which is provided at an outer side of the insertion frame 111a. A plurality of snapping blocks 111b are formed on the outer side of the insertion frame 111a, the first outer elastic finger 162 is formed with a snapping hole 162a which correspondingly engages with the snapping block 111b in form of tenon and mortise joint. Each second elastic grounding member 17 has a plurality of second elastic fingers 171 which are respectively positioned on a left side and a right side of the corresponding partitioning wall 12 and extend into the corresponding insertion space 13. The plurality of first elastic grounding members 16 and the plurality of second elastic grounding members 17 are used to correspondingly elastically contact an outer surface of the pluggable module 300 which is inserted into the insertion space 13.

In addition, a fixing structure 112c is formed at an outer side of each side frame portion 112 of each frame 11 of the two cages 1 and has a locking hole, and the fixing structures 112c of the frames 11 of the two cages 1 can be fixed relative to each other by a thread locking member (not shown), so that the two cages 1 are assembled together and are fixed relative to each other. In addition, front segments of the two side frame portions 112 of the upper cage 1a each are formed with a circuit board fixing structure S which extends downwardly and has a locking hole, the circuit board fixing structure S can be locked on the circuit board 200 by a thread locking member.

The plurality of receptacle connectors 2 are received in the two cages 1 and are arranged side by side on the circuit board 200 along the left-right direction D2. Each receptacle connector 2 includes a housing 21 which is insulative and a plurality of terminals 22. The housing 21 has two mating slots 211 which face forwardly and are arranged in the up-down direction D1, the two mating slots 211 respectively correspond to one of the plurality of insertion spaces 13 of the upper cage 1a and one of the plurality of insertion spaces 13 of the lower cage 1b. The plurality of terminals 22 are provided in the two mating slots 211 and tails (not shown) of the plurality of terminals 22 extend out of the housing 21 to be mechanically and electrically connected to the circuit board 200, but the present disclosure is not limited thereto, for example, each terminal 22 of the receptacle connector 2 is not necessarily connected to the circuit board 200, but each terminal 22 also may be connected to a cable. In addition, in the first embodiment, the connector assembly 100 further includes a rear cover 6 which is provided to and covers a rear segment of the two cages 1 and covers the plurality of receptacle connectors 2 and a plurality of rear partitioning walls 7 which are assembled to the rear cover 6 and each are positioned between two adjacent receptacle connectors 2 to partition the plurality of receptacle connectors 2 from each other. Specifically, the rear cover 6 has a shape of a substantially L-shaped plate, and the rear cover 6 is formed with a plurality of assembling holes 61 which penetrate a top portion of the rear cover 6 and a plurality of limiting grooves 62 which are formed to a front side of a rear portion of the rear cover 6. Rear edges of the plurality of rear partitioning walls 7 snap into the plurality of limiting grooves 62 respectively, and a top edge of each rear partitioning wall 7 is formed with a plurality of assembling pieces 71 which correspondingly snap into the assembling holes 61. In assembling, the plurality of assembling pieces 71 correspondingly pass through the assembling holes 61 and then bend so that the rear partitioning wall 7 are engaged with the rear cover 6. In addition, the rear cover 6 is formed with two positioning posts 63 which are respectively positioned at a left side and a right side of a front end of the rear cover 6, the two side frame portions 112 of the frame 11 positioned in the upper are formed with two positioning grooves 112d which respectively allow the two positioning posts 63 to snap therein. Moreover, the rear cover 6 is further formed with a circuit board mounting structure S (see FIG.

8) which has a locking hole, the circuit board mounting structure S can be locked to the circuit board 200 through a thread locking member 400. When the mating portion 301 of the pluggable module 300 is inserted into the insertion space 13, a mating circuit board 302 which is provided at a tip of the mating portion 301 of the pluggable module 300 can be inserted into the corresponding mating slot 211 to mate with the terminals 22 of the receptacle connector 2.

Referring to FIG. 1 and FIG. 5 to FIG. 8, the first liquid cooling tray 3 is provided at a top portion of the upper cage 1a, a lower surface of the first liquid cooling tray 3 spans the top portion of the upper cage 1a and constitutes an upper wall surface of each of the plurality of insertion spaces 13 of the upper cage 1a. The second liquid cooling tray 4 is provided between the upper cage 1a and the lower cage 1b, an upper surface of the second liquid cooling tray 4 spans a bottom of the upper cage 1a and constitutes a lower wall surface of each of the plurality of insertion spaces 13 of the upper cage 1a, a lower surface of the second liquid cooling tray 4 spans a top portion of the lower cage 1b and constitutes an upper wall surface of each of the plurality of insertion spaces 13 of the lower cage 1b. The first liquid cooling tray 3 and the second liquid cooling tray 4 are used to circulate a cooling liquid therein, the first liquid cooling tray 3 and the second liquid cooling tray 4 each include a tray body P which allows a cooling liquid to flow therein. The cooling liquid may be for example water or other cooling liquids, the tray body P is for example a metal (for example copper or aluminum) in material and has an inlet I and an outlet O which are positioned respectively at a left side and a right side of the tray body P to allow the cooling liquid to flow in and flow out respectively, a channel R which is positioned inside the tray body P and is communicated between the inlet I and the outlet O and a plurality of heat dissipation fins F which are provided in the channel R. In the first embodiment, the tray body P is a two-piece item composed of an upper component and a lower component which can be assembled together, but the present disclosure is not limited thereto. The first liquid cooling tray 3 and the second liquid cooling tray 4 can be used together with other components of a liquid cooling heat dissipation system (not shown), so that the cooling liquid can dissipate heat via the liquid cooling heat dissipation system after absorbing heat from the first liquid cooling tray 3 and second liquid cooling tray 4 and leaving the first liquid cooling tray 3 and second liquid cooling tray 4. The liquid cooling heat dissipation system may for example include a fluid guiding pipe, a heat dissipation row, a heat dissipation fan, a pump, a water tank and the like, the above components may be provided outside the connector assembly 100.

It is noted that, the cage 1 may also be only one in number, and at this time, the first liquid cooling tray 3 and the second liquid cooling tray 4 are respectively positioned above and below the cage 1, the cage 1 also may be three or more in number, the first liquid cooling tray 3 and the second liquid cooling tray 4 each also may be two or more in number, in other words, the cage 1, the first liquid cooling tray 3, and the second liquid cooling tray 4 can be adjusted in number as desired, which is not limited to the first embodiment.

Specifically, the frame 11 of each cage 1 is formed with a front assembling groove 111c which is positioned on an inner side surface of the front frame portion 111, is formed forwardly and extends transversely and a plurality of rear assembling grooves 113a which are positioned to the rear frame portion 113 and are formed downwardly first and then forwardly. The first liquid cooling tray 3 is formed with a front assembling protruding bar 31 which is formed forwardly and snaps forwardly into the front assembling groove 111c of the upper cage 1a and a plurality of rear assembling posts 32 which correspondingly snap into the plurality of rear assembling grooves 113a of the upper cage 1a respectively, and the rear assembling post 32 has a L-shaped structure toward forwardly. The second liquid cooling tray 4 is formed with a front assembling protruding bar 41 which is formed forwardly and snaps forwardly into the front assembling groove 111c of the lower cage 1b and a plurality of rear assembling posts 42 which correspondingly snap into the rear assembling grooves 113a of the lower cage 1b respectively, the rear assembling post 42 has a L-shaped structure toward forwardly. Specifically, a stopping block 1130 is formed at a top of a front end of each rear assembling groove 113a, after the rear assembling post 32 and the rear assembling post 42 which each have the L-shaped structure toward forwardly each snaps forwardly into the rear assembling groove 113a, each of the front assembling post 32 and the rear assembling post 42 will be stopped by the stopping block 1130 to prevent each of the front assembling post 32 and the rear assembling post 42 from being detached from the rear assembling groove 113a. In the first embodiment, the front assembling groove 111c has a main groove portion 111d which is formed forwardly and extends transversely and an alignment groove portion 111e which is formed forwardly and extends upwardly from the main groove portion 111d, the front assembling protruding bar 31,41 has a main protruding bar portion 311, 411 which is formed forwardly and extending in the left-right direction D2 and an alignment protruding bar portion 312, 412 which is formed forwardly and extends upwardly from a center of the main protruding bar portion 311, 411, the main groove portion 111d corresponding cooperates with the main protruding bar portion 311,411, and the alignment groove portion 111e correspondingly cooperates with the alignment protruding bar portion 312,412, by that the alignment groove portion 111e and the alignment protruding bar portion 312, 412 cooperate with each other, a position of each of the first liquid cooling tray 3 and the second liquid cooling tray 4 in the left-right direction D2 relative to the corresponding cage 1 can be further ensured. The connector assembly 100 further includes a plurality of fixing members which are used to fix the first liquid cooling tray 3 and the upper cage 1a and fix the second liquid cooling tray 4 and the lower cage 1b. In the first embodiment, the plurality of fixing members are thread locking members 500 which correspondingly pass through and lock the first liquid cooling tray 3 and the rear frame portion 113 of the upper cage 1a and correspondingly pass through and lock the second liquid cooling tray 4 and the rear frame portion 113b of the lower cage 1b. When the first liquid cooling tray 3 and the second liquid cooling tray 4 are to be assembled to the upper cage 1a and the lower cage 1b respectively, the plurality of rear assembling posts 32, 42 firstly extend downwardly into the plurality of rear assembling grooves 113a respectively and the front assembling protruding bar 31, 41 aligns with the front assembling groove 111c, and then the first liquid cooling tray 3 or the second liquid cooling tray 4 is moved forwardly to make the front assembling protruding bar 31, 41 snapped into the front assembling groove 111c and the plurality of rear assembling posts 32, 42 snapped into the plurality of rear assembling grooves 113a respectively, and then the thread locking member 500 (the fixing member) passes through and locks the first liquid cooling tray 3 and the upper cage 1a and the thread locking member 500 (the fixing member) passes through and locks the second liquid cooling tray 4 and the lower cage 1b, therefore the first liquid cooling tray 3 and the second liquid cooling tray 4 are respectively assembled to the upper cage 1a and the lower cage 1b.

Referring to FIG. 2, FIG. 4, FIG. 7 and FIG. 8, the plurality of pressuring springs 5 are independent members, are assembled on the upper surface of the second liquid cooling tray 4 and the bottom plate portion 151 of the bottom plate 15 respectively, and are correspondingly positioned in the insertion spaces 13 respectively. Pressuring direction of the pressuring springs 5 which are assembled on the upper surface of the second liquid cooling tray 4 each are toward the first liquid cooling tray 3, pressuring directions of the pressuring springs 5 which are assembled on the bottom plate portion 151 of the bottom plate 15 each are toward the second liquid cooling tray 4. In the first embodiment, each pressuring spring 5 has a mounting portion 50 which is assembled to the upper surface of the second liquid cooling tray 4 or the bottom plate portion 151 of the bottom plate 15 and two spring plates 53 which extend from the mounting portion 50 and extend into the corresponding insertion space 13. The mounting portion 50 has a plate body 51 which is assembled to the upper surface of the second liquid cooling tray 4 or the bottom plate portion 151 of the bottom plate 15 and a frame body 52 which is folded back from the plate body 51 onto an upper surface of the plate body 51. The two spring plates 53 each rearwardly extend integrally from an inner edge of the frame body 52 and extend into the corresponding insertion space 13. It is noted that, in other embodiments, the spring plate 53 also may be adjusted to one or three or more in the number as desired, which is not limited to the first embodiment. In addition, in the first embodiment, a lower surface of the plate body 51 of the mounting portion 50 of the pressuring spring 5 which is assembled to the upper surface of the second liquid cooling tray 4 is provided on the second liquid cooling tray 4 by welding. The upper surface of the second liquid cooling tray 4 is formed with recessed grooves 43 which allow the plate bodies 51 of the pressuring springs 5 to be provided respectively. The bottom plate portion 151 of the bottom plate 15 is formed with windows 151a which correspond to the pressuring springs 5 respectively, the upper surface of the plate body 51 of the pressuring spring 5 which is assembled to the bottom plate 15 is provided to a lower surface of the bottom plate portion 151 at the window 151a by welding, the spring plates 53 of the pressuring spring 5 extend into the insertion space 13 via the window 151a, the plate body 51 of the pressuring spring 5 forms a complete plate shape which can shield the window 151a after assembled. However, the providing method can be adjusted as desired, for example, the plate body 51 of the pressuring spring 5 may also be provided to the second liquid cooling tray 4 or the bottom plate 15 by existing providing methods such as latching and riveting. Moreover, in a varied embodiment, the plate body 51 of the pressuring spring 5 also may be provided on the upper surface of the bottom plate portion 151 of the bottom plate 15, so the bottom plate portion 151 of the bottom plate 15 does not need to have the window 151a, in addition, the upper surface of the second liquid cooling tray 4 also may not be formed with the recessed grooves 43 which allow the plate bodies 51 of the pressuring springs 5 to be provided respectively, which is not limited to the first embodiment. Furthermore, although a tip of the spring plate 53 can directly abut against the plate body 51 to be supported by the plate body 51 (see FIG. 8) in the first embodiment, in other embodiments, the tip of the spring plate 53 also may be spaced apart from the plate body 51 by a certain distance, but only when the spring plate 53 is pressed down does the spring plate 53 abuts against the plate body 51 so as to be supported by the plate body 51, so the present disclosure is not limited to the first embodiment. By that the first liquid cooling tray 3 and the second liquid cooling tray 4 are provided to the two cages 1 and directly constitute the wall surfaces of the insertion spaces 13 and the pressuring springs 5 correspondingly extend into the insertion spaces 13 respectively and the pressuring direction of each pressuring spring 5 is toward the first liquid cooling tray 3 or the second liquid cooling tray 4, the pluggable module 300 (see FIG. 1) which is inserted into the connector assembly 100 can be pushed by the pressuring spring 5 to directly contact the surface of the first liquid cooling tray 3 or the surface of the second liquid cooling tray 4, so the first liquid cooling tray 3 or the second liquid cooling tray 4 can directly contact the heat source (the pluggable module 300) to improve the heat dissipation efficiency, and the first liquid cooling tray 3 and the second liquid cooling tray 4 can be simplified in structure to make manufacturing and assembling of the connector assembly 100 easier.

Referring to FIG. 1 and FIG. 4 to FIG. 8, in addition, the partitioning wall 12 of the upper cage 1a is further assembled to the first liquid cooling tray 3 and the second liquid cooling tray 4, and the partitioning wall 12 of the lower cage 1b is further assembled to the second liquid cooling tray 4 and the bottom plate portion 151 of the bottom plate 15. A plurality of first positioning recesses 33 are formed on the lower surface of the first liquid cooling tray 3, a plurality of second positioning recesses 44 are formed on each of the upper surface and the lower surface of the second liquid cooling tray 4, and the bottom plate portion 151 of the bottom plate 15 is formed with a plurality of assembling holes 151b which penetrate the bottom plate portion 151. Each partitioning wall 12 of the upper cage 1a is formed with positioning protrusions 122 which are respectively snapped into the corresponding first positioning recess 33 and the corresponding second positioning recess 44, and each partitioning wall 12 of the lower cage 1b is formed with a positioning protrusion 122 which is snapped into the corresponding second positioning recess 44 and an assembling piece 123 which is snapped into the corresponding assembling hole 151b. It is noted that, the positioning protrusion 122 extends from the partitioning wall 12 and bends. In addition, when the partitioning wall 12 is assembled to the bottom plate 15, the assembling piece 123 passes through the corresponding assembling hole 151b and then the assembling piece 123 can be bent to make the partitioning wall 12 engaged with the bottom plate 15.

Figure 9:
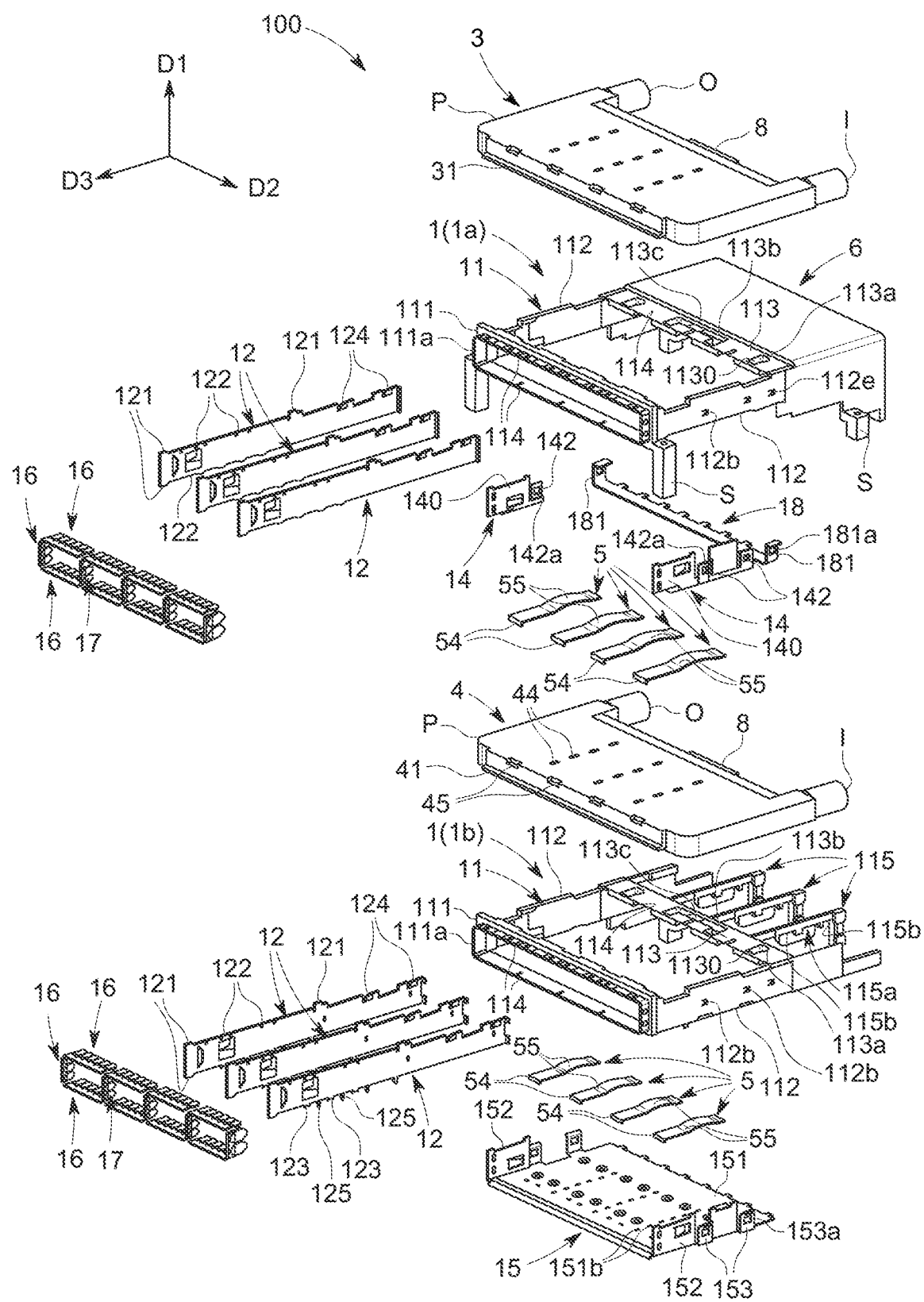
FIG. 9 is a perspective exploded view of a second embodiment of the connector assembly of the present disclosure.
Figure 10:
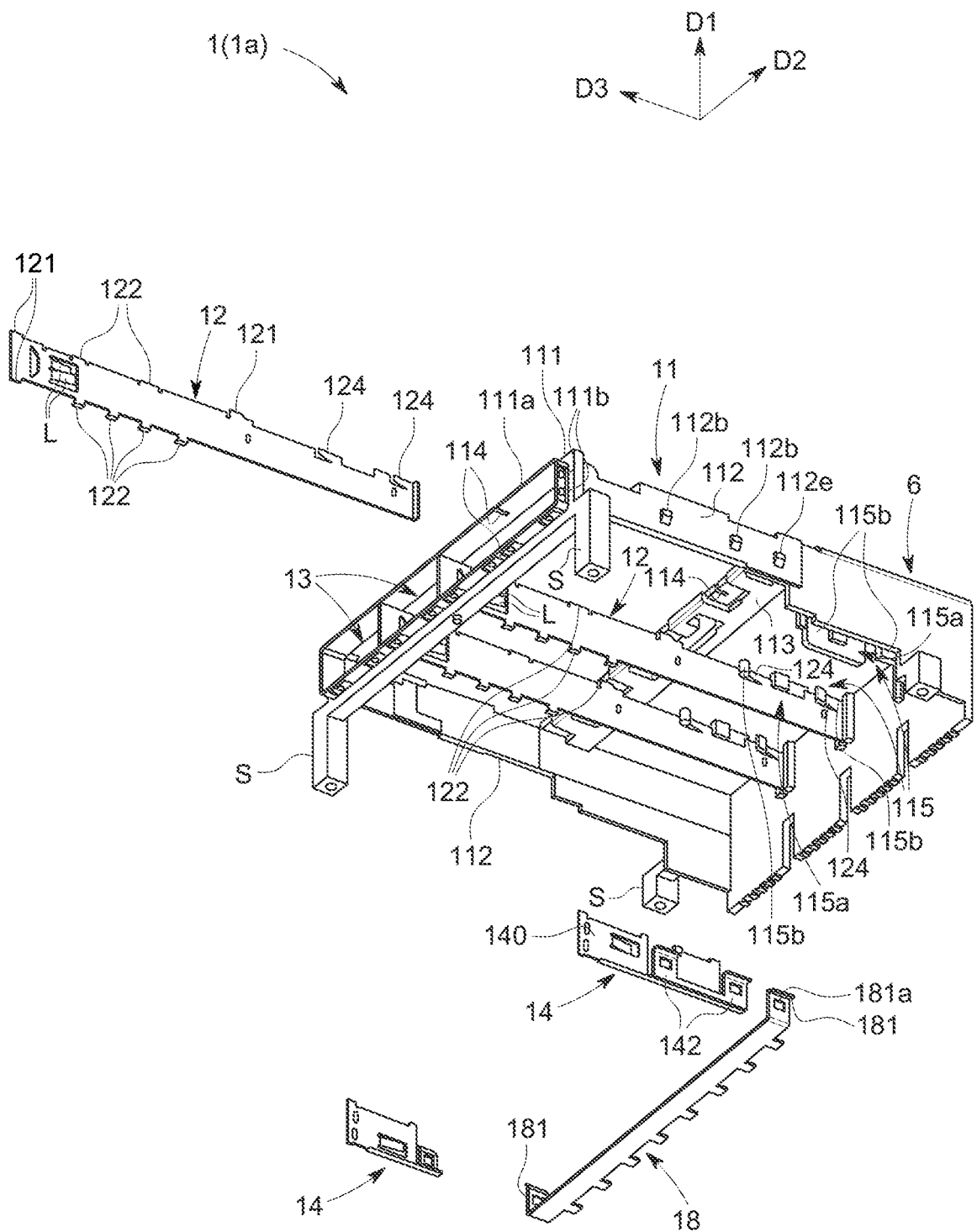
FIG. 10 is a perspective exploded view of a cage of the second embodiment positioned in the upper.
Figure 11:
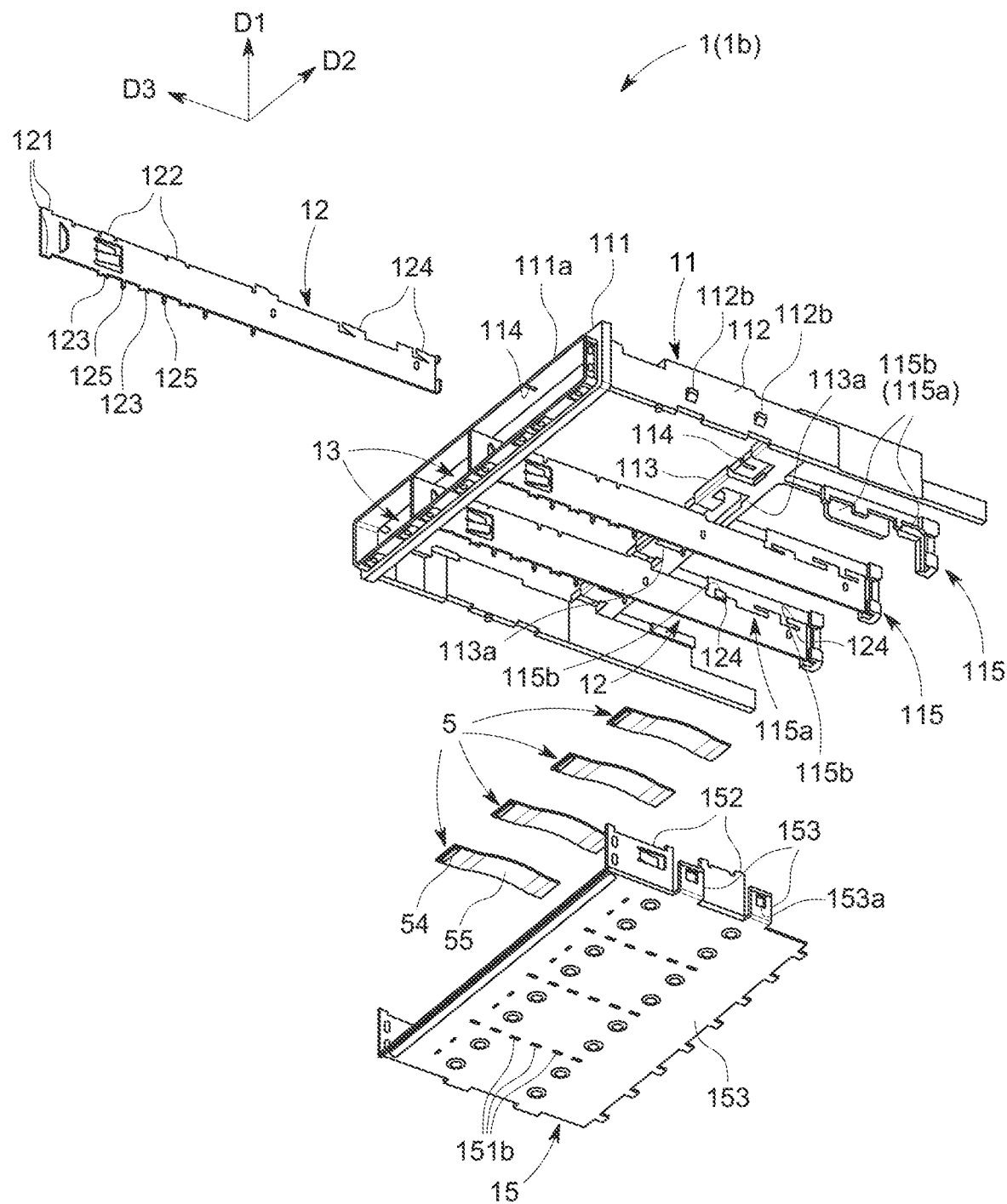
FIG. 11 is a perspective exploded view of a cage of the second embodiment positioned in the lower.

Referring to FIG. 9 to FIG. 11, a second embodiment of the connector assembly 100 of the present disclosure differs from the first embodiment in that, in the second embodiment, the rear cover 6 is integrally formed rearwardly from a rear end of the side frame portions 112 and the rear frame portion 113 of the upper cage 1a. The plurality of partitioning walls 12 are longer and extend rearwardly into the rear cover 6, the frame 11 of each cage 1 is further formed with a plurality of holding structures 115 which are positioned in a rear segment of the frame 11 and are respectively used to assemble with rear segments of the plurality of partitioning walls 12, the holding structure 115 of the upper cage 1a is formed to an inner side surface of the rear cover 6, and the holding structure 115 of the lower cage 1b extends rearwardly from the rear frame portion 113. Each holding structure 115 is formed with a clamping groove 115a which is opened downwardly and is used to receive the partitioning wall 12, and the clamping groove 115a has a plurality of lateral groove openings 115b facing laterally, each partitioning wall 12 is formed with a plurality of stopping pieces 124 which respectively correspond to the plurality of lateral groove openings 115b and obliquely extend forwardly and laterally, when the rear segment of the partitioning wall 12 is assembled to the holding structure 115 rearwardly, a top edge of the rear segment of the partitioning wall 12 is received in the clamping groove 115a and the plurality of stopping pieces 124 are latched with the plurality of lateral groove openings 115b respectively, which prevents the partitioning wall 12 from sliding relative to the frame 11. In addition, the upper cage 1a further has a bottom frame strip 18 which is provided below the frame 11 and extends transversely along the left-right direction D2, the bottom frame strip 18 is formed with two latching portions 181 which are positioned at a left end and a right end of the bottom frame strip 18 respectively and latch with the outer side surfaces of the two side frame portions 112 of the frame 11 respectively, each latching portion 181 is formed with a latching hole 181a which receives a latching block 112e on the outer side surface of the corresponding side frame portion 112. In addition, the partitioning wall 12 of the lower cage 1b is further formed with a grounding leg 125 which passes through the assembling hole 151b of the bottom plate portion 151 of the bottom plate 15 to insert into the circuit board 200 (see FIG. 1).

Figure 12:
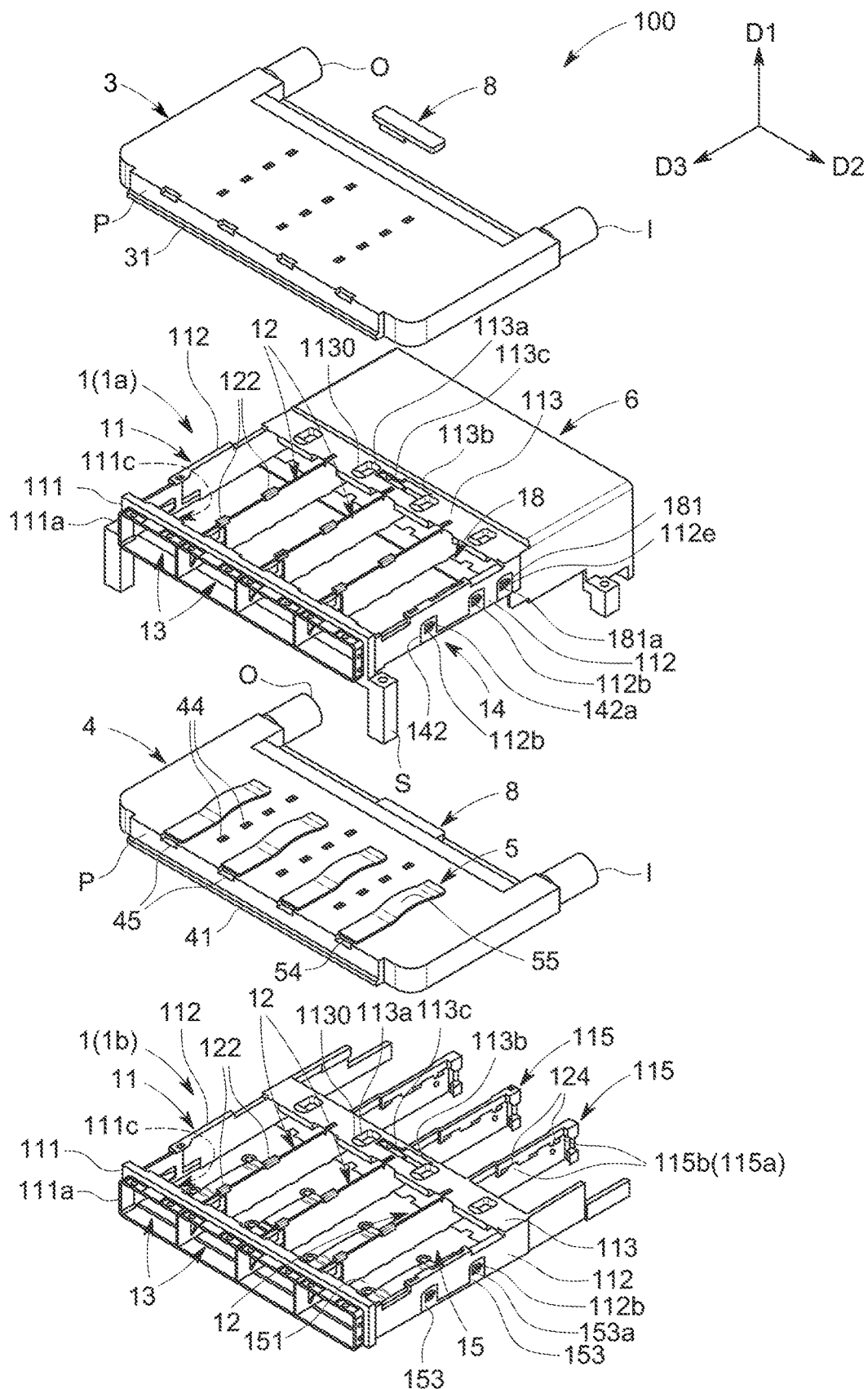
FIG. 12 is a perspective exploded view of the cages, a first liquid cooling tray and a second liquid cooling tray of the second embodiment.
Figure 13:
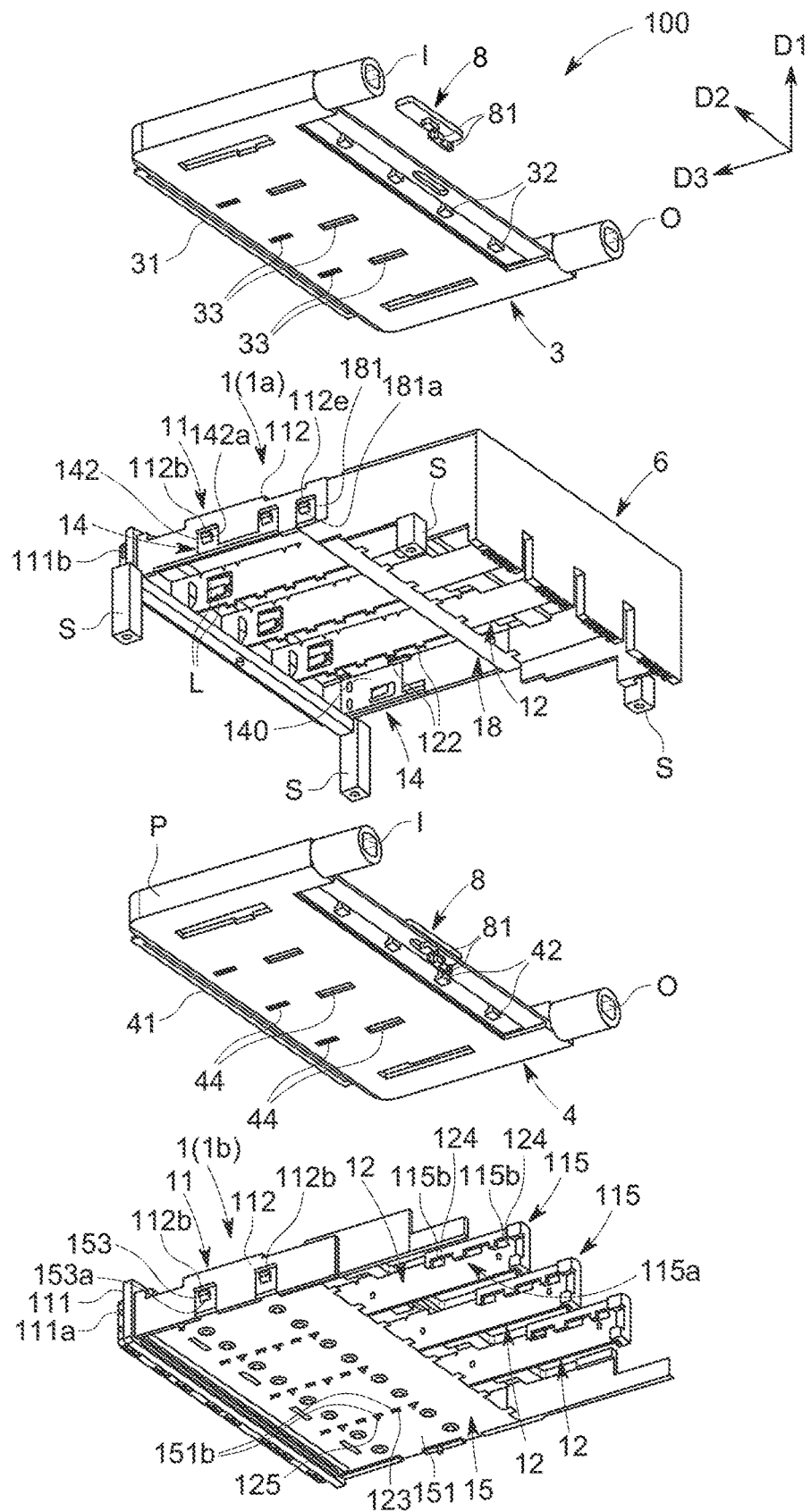
FIG. 13 is a perspective exploded view of the cages, the first liquid cooling tray and the second liquid cooling tray of the second embodiment of FIG. 12 viewed from another angle.

Referring to FIG. 9, FIG. 12 and FIG. 13, moreover, in the second embodiment, the plurality of fixing members are sliding lock members 8 which lock the first liquid cooling tray 3 and the rear frame portion 113 of the upper cage 1a and lock the second liquid cooling tray 4 and the rear frame portion 113 of the lower cage 1b. The rear frame portion 113 of each cage 1 is formed with a locking groove 113b, a stopping block 113c is formed behind a left side of the locking groove 113b, and two locking blocks 81 which correspond to the stopping block 113c are formed at a bottom of each sliding lock member 8, and the sliding lock members 8 pass through downwardly the first liquid cooling tray 3 and the second liquid cooling tray 4 respectively and can slid in the left-right direction D2. When the first liquid cooling tray 3 and the second liquid cooling tray 4 are to be assembled to the two cages 1, the plurality of rear assembling posts 32, 42 first extend downwardly into the plurality of rear assembling grooves 113a respectively and the rear assembling post 31, 32 aligns with the front assembling groove 111c, and then the first liquid cooling tray 3 or the second liquid cooling tray 4 is moved forwardly to make the front assembling protruding bar 31, 41 snapped into the front assembling groove 111c and the plurality of rear assembling post 32, 42 snapped into the plurality of rear assembling grooves 113a respectively, then the sliding lock member 8 (the fixing member) is moved toward the left to make the locking block 81 of the sliding lock member 8 lock the stopping block 113c at the locking groove 113b from below, so that the first liquid cooling tray 3 and the second liquid cooling tray 4 are assembled to the two cages 1 respectively.

Referring to FIG. 9 to FIG. 12, in addition, in the second embodiment, the mounting portion 54 of each pressuring spring 5 is positioned at a front end of each pressuring spring 5, and the spring plate 55 integrally extends rearwardly from the mounting portion 54 and extends into the corresponding insertion space 13. In addition, specifically, the mounting portion 54 of the pressuring spring 5 is assembled to the upper surface of the second liquid cooling tray 4 or the upper surface of the bottom plate portion 151 of the bottom plate 15 by welding, however, in other embodiments, the mounting portion 54 of the pressuring spring 5 also can be assembled by existing providing methods such as latching, riveting and the like, but the present disclosure is not limited thereto. Providing grooves 45 are formed downwardly at a front end of the upper surface of the second liquid cooling tray 4 and receive the mounting portions 54 of the pressuring springs 5 respectively, so as to strengthen holding force of the second liquid cooling tray 4 with respect to the pressuring springs 5.

In conclusion, in the present disclosure, by that the first liquid cooling tray 3 and the second liquid cooling tray 4 are provided to the two cages 1 and directly constitute the wall surfaces of the insertion spaces 13 and the pressuring springs 5 correspond to the insertion spaces 13 respectively and the pressuring direction of each pressuring spring 5 is toward the first liquid cooling tray 3 or the second liquid cooling tray 4, the pluggable module 300 which is inserted into the connector assembly 100 can be pushed by the pressuring spring 5 to directly contact the surface of the first liquid cooling tray 3 or the surface of the second liquid cooling tray 4, so the first liquid cooling tray 3 or the second liquid cooling tray 4 can directly contact the heat source (the pluggable module 300) to improve the heat dissipation efficiency, and the first liquid cooling tray 3 and the second liquid cooling tray 4 can be simplified in structure to make manufacturing and assembling of the connector assembly 100 easier.

However, the above description is only for the embodiments of the present disclosure, and it is not intended to limit the implementing scope of the present disclosure, and the simple equivalent changes and modifications made according to the claims and the contents of the specification are still included in the scope of the present disclosure.

What is claimed is:

1. A connector assembly, comprising:
    a cage comprising a frame and a plurality of partitioning walls, the frame and the plurality of partitioning walls defining an insertion space;
    a first liquid cooling tray provided to a top of the cage, a lower surface of the first liquid cooling tray constituting an upper wall surface of the insertion space;
    a second liquid cooling tray provided to a bottom of the cage, an upper surface of the second liquid cooling tray constituting a lower wall surface of the insertion space; and
    a pressuring spring within the insertion space.

2. The connector assembly of claim 1, wherein the pressuring spring is provided on the upper surface of the second liquid cooling tray within the insertion space.

3. The connector assembly of claim 1, wherein the pressuring spring comprises a plurality of spring plates extending into the insertion space from the upper surface of the second liquid cooling tray.

4. The connector assembly of claim 1, wherein the pressuring spring comprises a mounting portion assembled to the upper surface of the second liquid cooling tray and a spring plate extending from the mounting portion into the insertion space.

5. The connector assembly of claim 4, wherein:
    the mounting portion of the pressuring spring comprises a plate body assembled to the upper surface of the second liquid cooling tray and a frame body folded back from the plate body onto an upper surface of the plate body; and
    the spring plate extends from an inner edge of the frame body into the insertion space.

6. The connector assembly of claim 4, wherein:
    the mounting portion of the pressuring spring is positioned at a front end of the pressuring spring; and the spring plate extends from the mounting portion into the insertion space.

7. The connector assembly of claim 1, wherein the plurality of partitioning walls are assembled to the first liquid cooling tray and the second liquid cooling tray.

8. The connector assembly of claim 1, wherein:
a first positioning recess is formed on the lower surface of the first liquid cooling tray;
a second positioning recess is formed on the upper surface of the second liquid cooling tray; and
a partitioning wall among the plurality of partitioning walls comprises positioning protrusions which are snapped into the first positioning recess and the second positioning recess.

9. The connector assembly of claim 1, wherein:
the plurality of partitioning walls define a plurality of insertion spaces;
the lower surface of the first liquid cooling tray constitutes an upper wall surface of the plurality of insertion spaces; and
the upper surface of the second liquid cooling tray constitutes a lower wall surface of the plurality of insertion spaces.

10. The connector assembly of claim 9, wherein:
the insertion space comprises a first insertion space among the plurality of insertion spaces; and
the connector assembly further comprises a second pressuring spring within a second insertion space among the plurality of insertion spaces.

11. A connector assembly, comprising:
a cage comprising an upper cage and a lower cage, the cage comprising a frame and a plurality of partitioning walls, the frame and the plurality of partitioning walls defining an upper insertion space in the upper cage and a lower insertion space in the lower cage;
a first liquid cooling tray provided to a top of the upper cage, a lower surface of the first liquid cooling tray constituting an upper wall surface of the upper insertion space;
a second liquid cooling tray provided between the upper cage and the lower cage, an upper surface of the second liquid cooling tray constituting a lower wall surface of the upper insertion space, a lower surface of the second liquid cooling tray constituting an upper wall surface of the lower insertion space;
a first pressuring spring within the upper insertion space; and
a second pressuring spring within the lower insertion space.

12. The connector assembly of claim 11, wherein:
the first pressuring spring is provided on the upper surface of the second liquid cooling tray within the upper insertion space; and
the second pressuring spring is provided on the lower surface of the second liquid cooling tray within the lower insertion space.

13. The connector assembly of claim 11, wherein:
the first pressuring spring comprises a first plurality of spring plates extending into the upper insertion space from the upper surface of the second liquid cooling tray; and
the second pressuring spring comprises a second plurality of spring plates extending into the lower insertion space from the lower surface of the second liquid cooling tray.

14. The connector assembly of claim 11, wherein:
the first pressuring spring comprises a first mounting portion assembled to the upper surface of the second liquid cooling tray and a first spring plate extending from the first mounting portion into the upper insertion space; and
the second pressuring spring comprises a second mounting portion assembled to the lower surface of the second liquid cooling tray and a second spring plate extending from the second mounting portion into the lower insertion space.

15. The connector assembly of claim 11, wherein the plurality of partitioning walls are assembled to the first liquid cooling tray and the second liquid cooling tray.

16. The connector assembly of claim 11, wherein:
a first positioning recess is formed on the lower surface of the first liquid cooling tray;
a second positioning recess is formed on the upper surface of the second liquid cooling tray; and
a partitioning wall among the plurality of partitioning walls comprises positioning protrusions which are snapped into the first positioning recess and the second positioning recess.

17. The connector assembly of claim 11, wherein:
the upper insertion space comprises plurality of upper insertion spaces;
the lower surface of the first liquid cooling tray constitutes an upper wall surface of the plurality of upper insertion spaces; and
the upper surface of the second liquid cooling tray constitutes a lower wall surface of the plurality of upper insertion spaces.

18. A connector assembly, comprising:
a cage comprising a frame and a plurality of partitioning walls, the frame and the plurality of partitioning walls defining an insertion space;
a liquid cooling tray provided to a top of the cage, a lower surface of the liquid cooling tray constituting an upper wall surface of the insertion space; and
a pressuring spring within the insertion space.

19. The connector assembly of claim 18, further comprising a second liquid cooling tray provided to a bottom of the cage, an upper surface of the second liquid cooling tray constituting a lower wall surface of the insertion space.

20. The connector assembly of claim 19, wherein the pressuring spring is provided on the upper surface of the second liquid cooling tray within the insertion space.

* * * * *